US007932178B2

(12) United States Patent
Teo et al.

(10) Patent No.: US 7,932,178 B2
(45) Date of Patent: Apr. 26, 2011

(54) INTEGRATED CIRCUIT HAVING A PLURALITY OF MOSFET DEVICES

(75) Inventors: Lee Wee Teo, Singapore (SG); Yong Meng Lee, Singapore (SG); Jeffrey Chee, Singapore (SG); Shyue Seng Tan, Singapore (SG); Chung Woh Lai, Singapore (SG); Johnny Widodo, Singapore (SG); Zhao Lun, Singapore (SG); Shailendra Mishra, Beacon, NY (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 173 days.

(21) Appl. No.: 11/617,552

(22) Filed: Dec. 28, 2006

(65) Prior Publication Data

US 2008/0157223 A1    Jul. 3, 2008

(51) Int. Cl.
*H01L 21/44* (2006.01)

(52) U.S. Cl. ................. 438/666; 438/279; 257/E21.598

(58) Field of Classification Search .................. 257/288, 257/E21.598; 438/279, 294–297, 666
See application file for complete search history.

(56) References Cited

U.S. PATENT DOCUMENTS

| | | | |
|---|---|---|---|
| 6,204,542 B1 * | 3/2001 | Kinoshita et al. | 257/401 |
| 2005/0032275 A1 * | 2/2005 | Toda et al. | 438/123 |
| 2005/0098829 A1 * | 5/2005 | Doris et al. | 257/351 |
| 2005/0233540 A1 * | 10/2005 | Yoon et al. | 438/424 |
| 2006/0131662 A1 * | 6/2006 | Yamada et al. | 257/374 |

* cited by examiner

*Primary Examiner* — Thao X Le
*Assistant Examiner* — Robert Huber

(57) ABSTRACT

A method is provided for manufacturing an integrated circuit having a plurality of MOSFET devices, comprising the steps of: providing a plurality of MOSFET devices each having a first and a second structural parameter associated therewith, wherein a value of one of the first and a second structural parameter of each device is selected to provide a value of a performance parameter of the device substantially equal to a predetermined reference value, the predetermined reference value being the same for each device.

6 Claims, 6 Drawing Sheets

INTEGRATED CIRCUIT HAVING A PLURALITY OF MOSFET DEVICES

TECHNICAL FIELD

The present invention relates to semiconductor integrated circuits, and more particularly to an integrated circuit with MOSFET devices.

BACKGROUND ART

A known MOSFET 10 is shown schematically in FIG. 1. A MOSFET 10 is typically fabricated on a semiconductor substrate 12 such as silicon and has a source region 15 (also known as a 'deep' source region) and a drain region 16 (also known as a 'deep' drain region) separated by a conduction channel 17.

A gate stack 18 is provided over the conduction channel 17 (hereinafter referred to as the 'channel'). The gate stack 18 is formed from a gate dielectric layer 19 above the channel 17, and a gate electrode 20 above the gate dielectric layer 19. The application of a potential to the gate electrode 20 allows a flow of current along a length of the channel 17 between the source 15 and the drain 16 to be controlled.

The gate stack 18 is provided with spacer elements 21, 22 on a source side and a drain side, respectively, of the gate stack 18. The purpose of the spacer elements 21, 22 is to define boundaries of the source and drain regions 15, 16 with respect to the channel 17. For example, the source and drain regions 15, 16 may be made by implantation of the substrate 12 with dopant.

The spacer elements 21, 22 may serve as an implantation mask during formation of the source and drain regions 15, 16 to define the boundary between the source and drain regions 15, 16 and the channel 17. Alternatively, the source and drain regions 15, 16 may be made by etching a source recess and a drain recess, and filling the recesses with in-situ doped silicon. In this case, the spacer elements 21, 22 serve to protect the underlying substrate from the effects of the etching process.

MOSFET devices may be formed having a channel region of either n-type doped semiconductor material (NFET device) or p-type doped semiconductor material (PFET device). A recent advance in the development of higher performance MOSFET devices has been the inclusion of strained silicon regions in the devices. It has been found that the drive current of an NFET may be enhanced by applying a tensile stress along the length of the channel 17. The performance of a p-type FET (PFET) may be enhanced by applying a compressive stress along the length of the channel 17 instead of a tensile stress.

However, if a compressive stress is applied along the length of the channel 17 of an NFET the performance of the NFET is degraded. Similarly, if a tensile stress is applied along the length of the channel 17 of a PFET, the performance of the PFET is degraded.

It is known that layers of material can be formed having either a tensile stress or a compressive stress, depending upon the conditions under which the layer is formed. By conditions is included parameters such as growth temperature, deposition rate, layer composition, etc. For example, silicon nitride layers may be formed having a compressive stress or tensile stress depending upon the conditions under which the silicon nitride layer is formed. The layer may induce a corresponding compressive or tensile stress in the structure underlying the layer.

The performance of PFET devices can thereby be enhanced by forming a compressive stressed silicon nitride layer over the PFET devices. The performance of NFET devices can be enhanced by forming a corresponding tensile stressed silicon nitride layer over the NFET devices.

FIG. 2 shows a pair of MOSFET devices 100 formed on a semiconductor substrate. The devices 100 have gate stacks 118, and sidewall spacers 121, 122 provided on sidewalls of the gate stacks 118. A stress liner layer 125 is provided over the MOSFET devices 100. The stress liner layer 125 is formed to have either a compressive stress or a tensile stress. A stress liner layer 125 having a compressive stress is formed over PFET devices, whilst a stress liner layer 125 having an internal tensile stress is formed over NFET devices.

MOSFET devices may be formed to have a nested configuration, or an isolated configuration. In a nested configuration, adjacent MOSFET devices are formed in close proximity to one another such that a single volume of doped semiconductor material forms the source region of one MOSFET device and the drain region of an adjacent MOSFET device. The devices thus 'share' a volume of doped semiconductor material. Nested devices may be formed such that a single silicide contact to the volume of doped semiconductor material serves as a source contact to one MOSFET device and as a drain contact to the adjacent MOSFET device.

In an isolated configuration, MOSFET devices are formed each having a single polycrystalline silicon gate region. In a nested configuration, a plurality of devices are provided, some of the polycrystalline silicon gate regions of the devices being connected to one another.

It is known that a performance difference exists between NFET and PFET devices. PFET devices generally have a performance that is inferior to that of NFET devices. This is at least partly due to the fact that in PFET devices holes are responsible for current conduction in the channel region of the device, whilst in NFET devices electrons are responsible for current conduction in the channel region.

However, it is also found that a difference in performance exists between PFET devices in a nested configuration when compared with PFET devices in an isolated configuration. PFET devices in a nested configuration are generally found to have inferior performance compared with PFET devices in an isolated configuration. This is at least partially due to the fact that as the PC to PC distance is reduced, the amount of stress liner layer present between adjacent PCs is reduced. A significant decrease in the amount of stress imparted to the substrate by the stress liner layer is observed as the PC to PC distance is reduced.

By 'performance' is meant a characteristic of the device such as an on-state drain current ($I_{on}$), a saturation drain current ($I_{dsat}$) or a maximum transconductance ($G_{max}$). By performance 'difference' between isolated and nested devices is meant that the value of a performance characteristic of a given nested MOSFET device is different from the corresponding value of a given isolated MOSFET device.

DISCLOSURE OF THE INVENTION

The present invention provides a method for manufacturing an integrated circuit, comprising the steps of: providing substrate and forming a plurality of MOSFET devices each having at least a first and a second structural parameter associated therewith wherein a value of at least one of said at least a first and a second structural parameter of each MOSFET device is selected to provide a value of a performance parameter of the device substantially equal to a predetermined reference value, the predetermined reference value being the same for each MOSFET device.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

Embodiments of the present invention will now be described hereinafter, by way of example only with reference to the accompanying drawings, in which.

DETAILED DESCRIPTION OF THE INVENTION

The following embodiments are intended to illustrate the invention more fully without limiting their scope, since numerous modifications and variations will be apparent to those skilled in the art.

Figure 1:
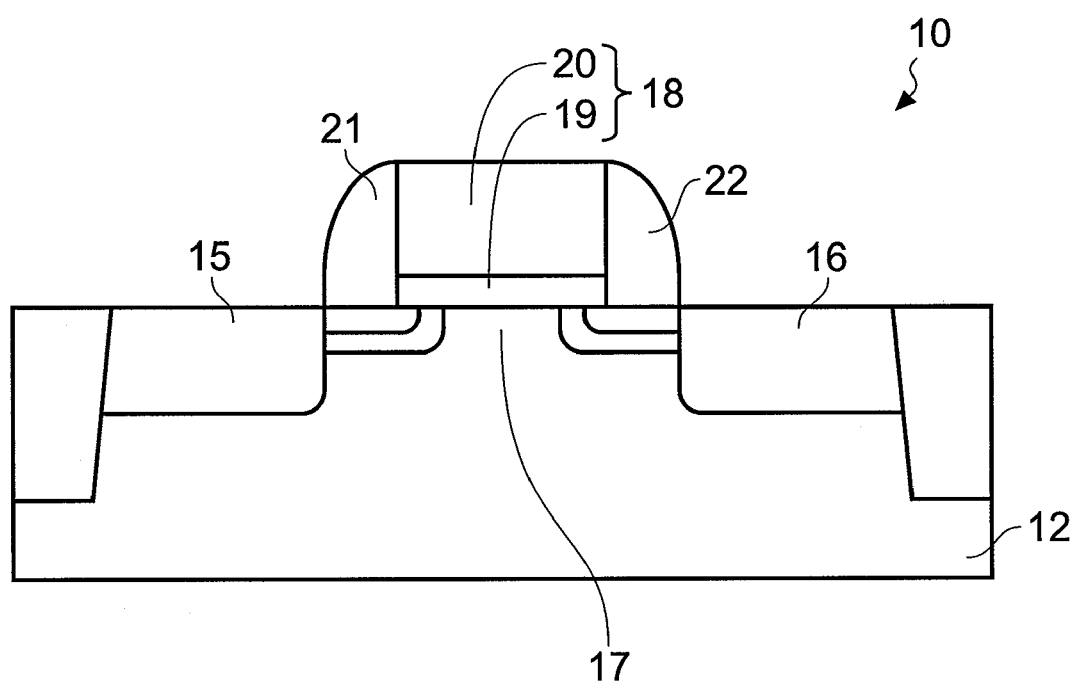
FIG. 1 is a cross-section illustrating a prior art MOSFET device.
Figure 2:
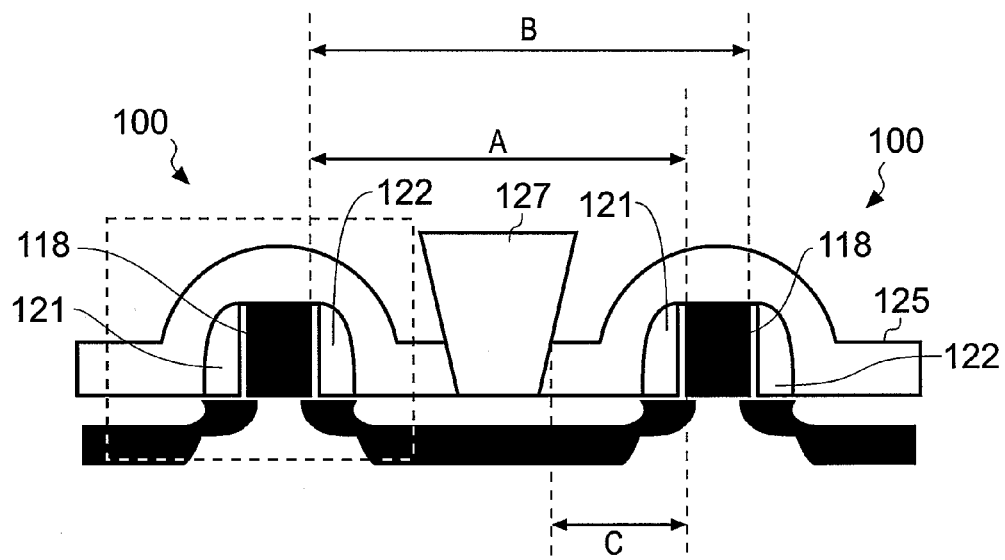
FIG. 2 is a cross-sectional view of a pair of prior art MOSFET devices.
Figure 3:
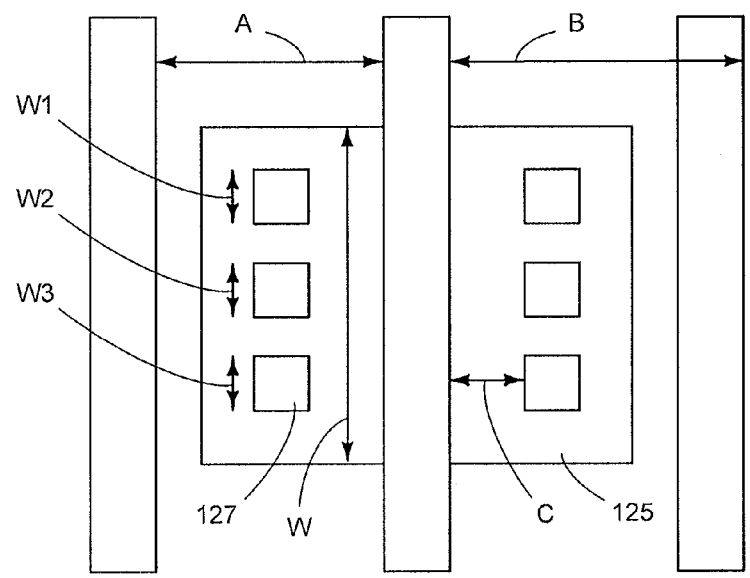
FIG. 3 is a plan view of a prior art MOSFET device.

FIG. 2 is a schematic diagram of a pair of MOSFET devices 100, whilst FIG. 3 shows a MOSFET device in plan-view. A stress liner layer 125 is provided over the devices shown in FIGS. 2 and 3. Holes have been etched through the stress liner layer 125, and contacts 127 formed through the holes.

Dimension 'A' in FIGS. 2 and 3 corresponds to the 'PC to PC' distance of adjacent devices. Dimension 'B' corresponds to the 'PC pitch' of adjacent devices, and dimension 'C' corresponds to the 'PC to CA' distance of a device.

The term 'PC' represents a shape that denotes the shape of polysilicon structures.

The term 'RX' represents a shape that denotes an opening in the field oxide, to expose the silicon substrate.

A transverse distance 'W' corresponds to the 'RX width' of a device, whilst W1, W2, W3 etc refer to the widths of individual contact holes in the liner layer 125. The contact holes are formed to make electrical contact between the device and a circuit element overlying the liner layer 125 such as an interconnect.

The term 'CA' refers to the contact holes in the stress liner layer 125.

A 'CA strap ratio' may be defined as the sum of the widths of individual contact holes, the sum being divided by the overall RX width W. Thus, in the case where three contact holes formed in the liner layer, of widths W1, W2 and W3 respectively, the CA strap ratio would be defined as (W1+W2+W3)/W.

A 'CA pitch' may be defined as the distance between centers of two adjacent contact holes.

Figure 4:
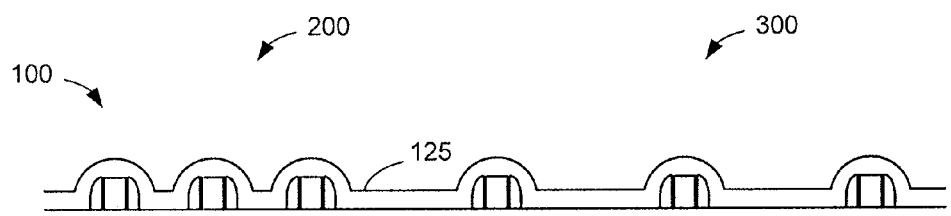
FIG. 4 is a cross-sectional view of a group of isolated devices and a group of nested device on a substrate, formed according to an embodiment of the invention.

FIG. 4 shows a cross-sectional view of a structure formed according to an embodiment of the invention. The structure comprises a group of nested MOSFET devices 200, and a group of isolated devices 300. In this structure, the value of PC pitch of the nested devices is clearly less than the value of the PC pitch of the isolated devices, contributing to a difference in the value of the performance characteristic $I_{on}$ of the isolated devices relative to the nested devices.

In the structure of FIG. 4, the CA strap ratio of the nested devices 200 and the CA strap ratio of the isolated devices 300 have been selected so as to reduce the difference in the value of $I_{on}$ between the nested devices 200 and the isolated devices 300. It will be appreciated that this is not directly apparent from FIG. 4 since FIG. 4 shows the devices in cross-section.

In some embodiments of the invention, isolated devices of a given type (such as PFET devices) are made with one value of CA strap ratio, whilst isolated devices of a different type (such as NFET devices) are made with a different value of CA strap ratio.

It will be appreciated that in some embodiments of the invention, the corresponding values of CA strap ratio for nested devices of different types (such as PFET or NFET) are varied accordingly, in order to reduce a difference in the value of $I_{on}$ between nested PFET and NFET devices.

It will also be appreciated that in an integrated circuit having isolated and nested devices, some of which are NFET devices (e.g., isolated and nested NFET devices are present), and some of which are PFET devices (e.g., isolated and nested PFET devices are present), the values of CA strap ratio of each group of devices of a given type may be different from one another.

Figure 5:
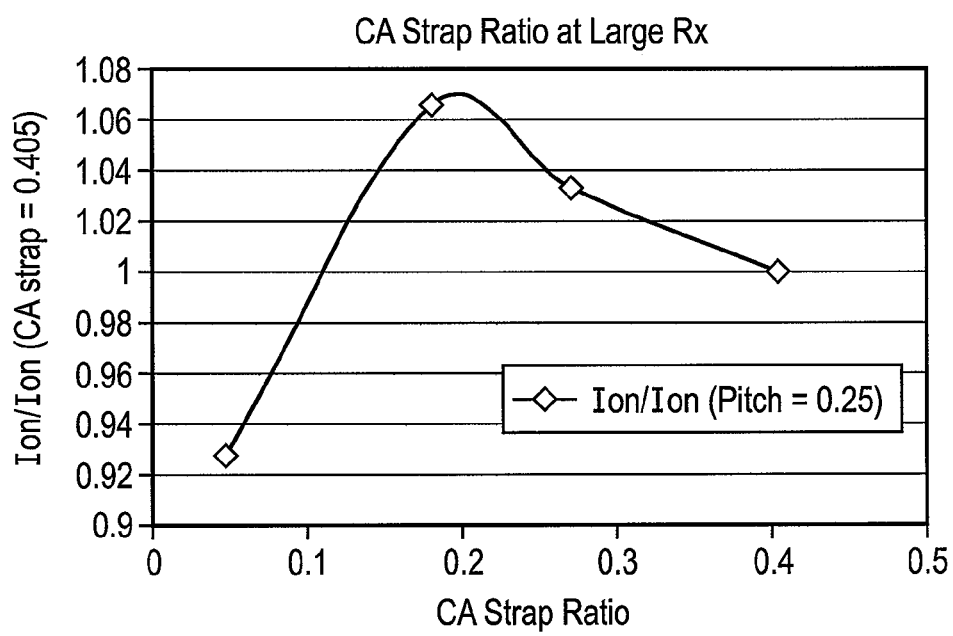
FIG. 5 is a plot of the ratio of $I_{on}/I_{on}$(CA strap ratio=0.405) as a function of CA strap ratio.

FIG. 5 shows a plot of the ratio of $I_{on}$ to the value of $I_{on}$ for a device having a CA strap ratio of 0.405, against the CA strap ratio of devices over a range of CA strap ratios from 0.04 to 0.405. The value of RX width is the same for each device. It can be seen that the ratio initially increases as the CA strap ratio increases, before falling to a value of 1 at a CA strap ratio of 0.405.

It will be understood that in some embodiments of the invention, performance data as a function of CA strap ratio and PC pitch for different values of RX will be required in order to obtain an equation describing the performance of devices as a function of the value of RX.

Figure 6:
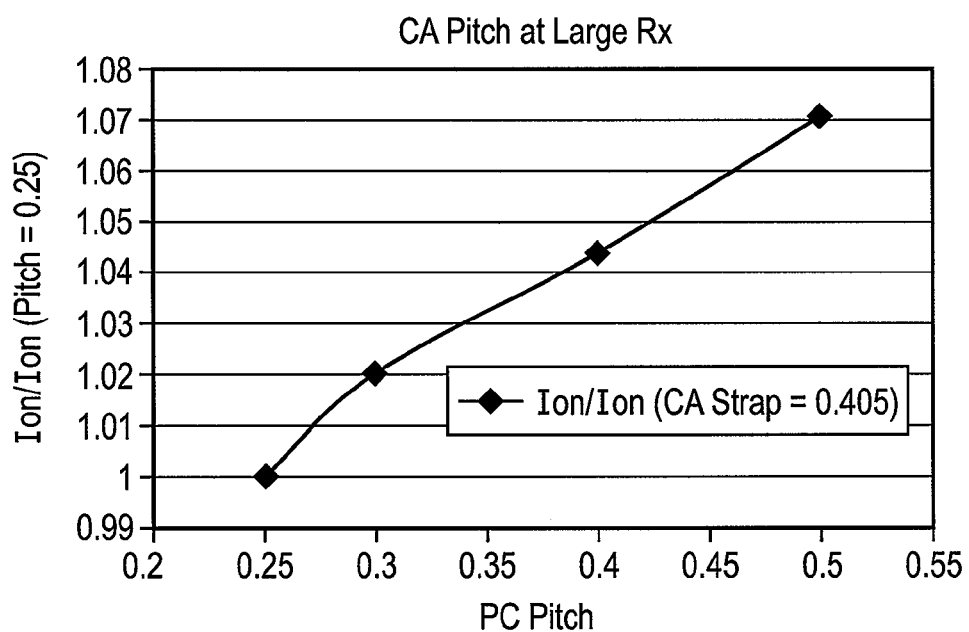
FIG. 6 is a plot of the ratio of $I_{on}/I_{on}$(PC pitch=0.25) as a function of PC pitch.

FIG. 6 shows a plot of the ratio of on to the value of $I_{on}$ for a device having a PC pitch of 0.25 μm, against the PC pitch of devices over a range of PC pitch values from 0.25 μm to 0.5 μm. Again, the values are for devices having the same value of RX width. The value of RX width is the same as that for the devices presented in FIG. 5. It can be seen from FIG. 6 that the ratio increases with PC pitch from a value of 1 at a pitch of 0.25 μm to a value of 1.07 at a pitch of 0.5 μm.

Figure 7:
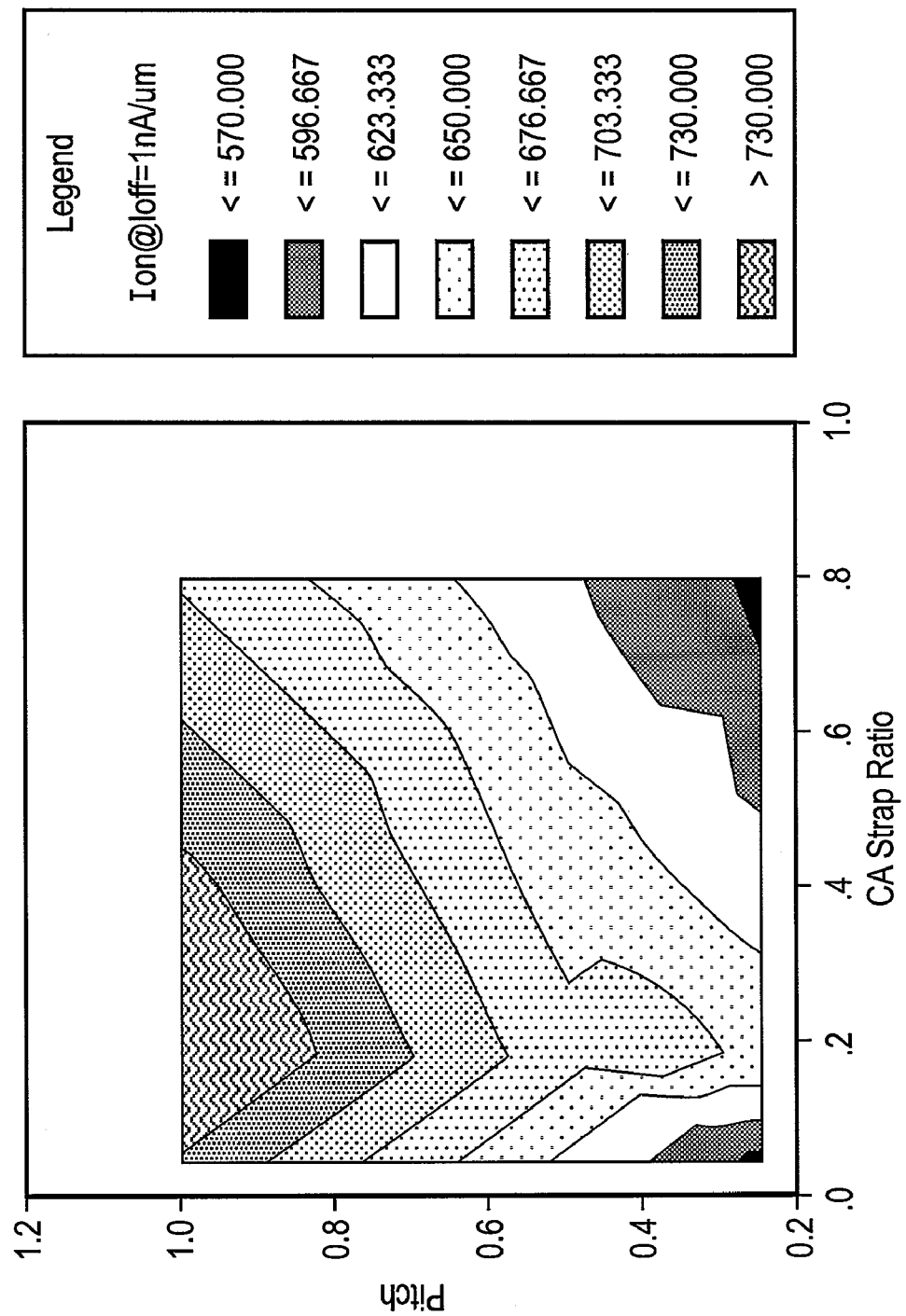
FIG. 7 is a plot of $I_{on}$ as a function of PC pitch and CA strap ratio.

FIG. 7 shows a plot of $I_{on}$ as a function of PC pitch and CA strap ratio, for a given value of RX width corresponding to that of FIGS. 4 and 5.

According to an embodiment of the present invention, a family of data sets representing $I_{on}$ as a function of PC pitch and CA strap ratio is obtained (see for example FIG. 6), for a range of values of RX width. For example, values of $I_{on}$ for a value of $I_{off}$ of 1 nA/um may be determined, or any other suitable value of $I_{off}$.

It will be understood that values of $I_{on}$ may be obtained for ranges of RX width, PC pitch and CA strap ratio different from those shown in FIGS. 4 to 6.

The relationship between the device characteristic Ion and the structural parameters CA strap ratio, RX width and PC pitch is then determined in functional form, i.e., a function of the form $I_{on}$=f (CA strap ratio, CA pitch, RX width, PC pitch) is determined.

An expected value of $I_{on}$ of a particular device can then be determined, given values of CA strap ratio, RX width and PC pitch for the device.

Conversely, if a device having a particular value of $I_{on}$ is required, for given values of RX width and PC pitch, a corresponding value of the CA strap ratio can be determined that will result in the desired value of $I_{on}$. It will be understood that, as an alternative, for given values of RX width and CA strap ratio, a corresponding value of PC pitch may be determined that will provide a desired value of $I_{on}$. In a further alternative, for given values of PC pitch and CA strap ratio, a corresponding value of RX width can be determined that will provide a desired value of $I_{on}$.

In practice it is found convenient to adjust the value of the CA strap ratio of a given device for fixed values of PC pitch and RX width corresponding to a given set of MOSFET devices.

For example, the PC pitch of isolated devices is greater than the PC pitch of nested devices. Using the function referred to above, values of CA strap ratio for nested devices in an integrated circuit, and values of CA strap ratio for isolated devices in said integrated circuit may be determined, for given values of RX width for each device, that will provide the same value of $I_{on}$ for both the isolated and nested devices of the integrated circuit.

The value of the CA strap ratio of a device may be conveniently varied between respective devices without requiring extensive redesign of the layout of the integrated circuit. Variation of the CA strap ratio has little or no effect on the overall size of a given set of devices. A circuit designer, having specified the parameters PC pitch, RX width etc associated with elements of an integrated circuit may use the function referred to above to calculate values of contact sizes (from the value of CA strap ratio for each device calculated according to the function).

It will be appreciated that some embodiments of the invention enable a reduction in the differences between $I_{on}$ values of MOSFET devices formed on an integrated circuit. Methods of fabricating devices according to some embodiments of the invention do not require extensive process modifications or extensive changes to the positions of MOSFET devices on an integrated circuit. Rather, a reduction in differences between $I_{on}$ values may be achieved by simply adjusting the dimensions of features within individual MOSFET devices such as the widths of contact holes formed through stress liner layers comprising an integrated circuit. The overall lateral dimensions of devices such as RX width and PC pitch thereby remain substantially unchanged.

It is an aim of the present invention to at least partly mitigate the above-mentioned problems.

It is a further aim of embodiments of the invention to provide an improved device structure.

Another aim of embodiments of the present invention is to provide a fabrication method for an improved device structure.

A still further aim of embodiments of the present invention is to reduce a performance difference between isolated and nested MOSFET devices formed on a semiconductor substrate.

According to a first aspect of the present invention there is provided a method for manufacturing an integrated circuit having a plurality of MOSFET devices, comprising the steps of: providing a plurality of MOSFET devices each having at least a first and a second structural parameter associated therewith, wherein a value of at least one of said at least a first and a second structural parameter of each device is selected to provide a value of a performance parameter of the device substantially equal to a predetermined reference value, said predetermined reference value being the same for each device.

According to a second aspect of the present invention there is provided a method for manufacturing an integrated circuit comprising a plurality of MOSFET devices, the integrated circuit having a reduced difference, between said devices, of a value of $I_{on}$, comprising the steps of: providing a plurality of MOSFET devices each having a respective PC pitch, an RX width and a CA strap ratio associated therewith, wherein a value of the CA strap ratio of each device is selected to provide a value of $I_{on}$ substantially equal to a predetermined reference value, said predetermined reference value being the same for each device.

According to a third aspect of the present invention there is provided an integrated circuit structure comprising a plurality of MOSFET devices, each device having associated therewith: a value of a performance parameter of the device; and a value of at least a first and a second structural parameter of the device, wherein the performance parameter of each device is related to the at least a first and second structural parameter of the device according to an identical predetermined function, and at least one of said at least a first and second structural parameters is selected so that the value of said performance parameter of each device is substantially equal.

According to a fourth aspect of the present invention there is provided an integrated circuit structure comprising a plurality of MOSFET devices, each device having associated therewith: a value of an on current ($I_{on}$) of the device; a value of a PC pitch of the device; a value of an RX width of the device; and a value of a CA strap ratio of the device, wherein the value of $I_{on}$ of each device is related to the values of PC pitch, RX width and CA strap ratio according to an identical predetermined function, and at least one of said values of PC pitch, RX width and CA strap ratio is selected so that the value of $I_{on}$ of each device is substantially equal.

According to a fifth aspect of the present invention there is provided a method for designing an integrated circuit comprising a plurality of MOSFET devices, each device having associated therewith a value of a performance parameter, and a value of at least a first and a second structural parameter, comprising the steps of: determining a value of at least one of said at least a first and second structural parameter of each device, said value being determined with reference to a predetermined function, whereby the value of said performance parameter of each device is substantially equal.

Embodiments of the invention provide MOSFET devices having a reduced performance difference between respective devices.

Embodiments of the invention provide MOSFET devices having a reduced performance difference between isolated and nested MOSFET devices. Still further embodiments of the invention provide MOSFET devices having a reduced performance difference between PFET and NFET devices.

It has been found that the removal of portions of the stress liner layer 125 modifies the stress distribution within the MOSFET devices 100. The modification of the stress distribution can contribute to a variation in the performance characteristics of MOSFET devices. The greater the amount of material removed, the greater the change in the performance characteristics of a device.

Removal of portions of the stress liner layer 125 occurs when holes are formed through the stress liner layer 125 to form electrical contacts to the underlying devices.

Embodiments of the present invention exploit this phenomenon in order to provide a way of reducing a difference in a value of a performance parameter between devices of an integrated circuit. Embodiments of the invention achieve this by careful control of the amount of material removed from the stress liner layer during device fabrication. In embodiments of the invention the CA strap ratio can be varied in order to control the amount of material removed.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit comprising:
    providing a first transistor comprising a first gate, first gate dielectric, first source/drain regions regions and a first channel region, the first gate being located at a first distance from a gate of a first adjacent transistor;
    providing a second transistor comprising a second gate, second gate dielectric, a second source/drain regions region and a second channel region, the second gate being located at a second distance from a gate of a second adjacent transistor, wherein the second distance is greater than the first distance;
    forming a stress liner layer covering the first and second transistors, the stress liner layer being capable of inducing stress on the first and second channel regions;
    forming a dielectric layer over the stress liner layer;
    forming first contact openings in communication with the first source/drain regions and second contact openings in communication with the second source/drain regions, the first and second contact openings extending through the dielectric layer and the stress layer; and
    wherein at least a CA strap ratio or CA pitch associated with the first contact openings is selected to have a different value from at least a CA strap ratio or CA pitch associated with the second contact openings so as to mitigate differences in stress induced on the first and second channel regions by the stress liner layer.

2. The method as claimed in claim 1, wherein at least the CA strap ratio or CA pitch associated with the first and second contact openings are selected so as to substantially match at least the Ion, Idsat, or Gmax of the first transistor with that for the second transistor.

3. The method as claimed in claim 1, wherein the first and second transistors are both NFET.

4. The method as claimed in claim 3, wherein the stress liner layer has a tensile stress and is capable of inducing a tensile stress on the first and second channel regions.

5. The method of claim 1, wherein the first and second transistors are both PFET.

6. The method as claimed in claim 5, wherein the stress liner layer has a compressive stress and is capable of inducing a compressive stress on the first and second channel regions.

* * * * *